(12) United States Patent
Kim et al.

(10) Patent No.: US 9,449,930 B2
(45) Date of Patent: Sep. 20, 2016

(54) SEMICONDUCTOR DEVICES AND PACKAGE SUBSTRATES HAVING PILLARS AND SEMICONDUCTOR PACKAGES AND PACKAGE STACK STRUCTURES HAVING THE SAME

(71) Applicants: Tae-Hyeong Kim, Suwon-si (KR); Yeong-Kwon Ko, Suwon-si (KR); Ji-Hwang Kim, Cheonan-si (KR); Sun-Kyoung Seo, Suwon-si (KR); Tae-Je Cho, Yongin-si (KR)

(72) Inventors: Tae-Hyeong Kim, Suwon-si (KR); Yeong-Kwon Ko, Suwon-si (KR); Ji-Hwang Kim, Cheonan-si (KR); Sun-Kyoung Seo, Suwon-si (KR); Tae-Je Cho, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/813,084

(22) Filed: Jul. 29, 2015

(65) Prior Publication Data

US 2016/0049377 A1 Feb. 18, 2016

(30) Foreign Application Priority Data

Aug. 12, 2014 (KR) .......................... 10-2014-0104440

(51) Int. Cl.

| | |
|---|---|
| *H01L 23/04* | (2006.01) |
| *H01L 23/48* | (2006.01) |
| *H01L 23/52* | (2006.01) |
| *H01L 21/44* | (2006.01) |
| *H01L 23/00* | (2006.01) |
| *H01L 25/065* | (2006.01) |
| *H01L 25/10* | (2006.01) |
| *H01L 25/00* | (2006.01) |

(52) U.S. Cl.
CPC ............. *H01L 24/06* (2013.01); *H01L 23/481* (2013.01); *H01L 24/14* (2013.01); *H01L 25/0657* (2013.01); *H01L 25/105* (2013.01); *H01L 25/50* (2013.01); *H01L 2224/0401* (2013.01); *H01L 2224/04042* (2013.01); *H01L 2224/0557* (2013.01); *H01L 2224/0605* (2013.01); *H01L 2224/065* (2013.01); *H01L 2224/06181* (2013.01); *H01L 2224/1405* (2013.01); *H01L 2224/14181* (2013.01); *H01L 2224/16227* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2225/06513* (2013.01); *H01L 2225/06541* (2013.01); *H01L 2225/06568* (2013.01); *H01L 2225/1023* (2013.01); *H01L 2225/1058* (2013.01); *H01L 2225/1094* (2013.01); *H01L 2924/15311* (2013.01); *H01L 2924/15331* (2013.01)

(58) Field of Classification Search
CPC .......... H01L 2924/15311; H01L 2224/73204; H01L 2224/32145; H01L 2224/94; H01L 25/0657; H01L 21/76898; H01L 23/49827; H01L 2224/16145; H01L 2224/81; H01L 2225/06513; H01L 23/5226; H01L 24/17
USPC .................................. 438/106–109, 612–61
See application file for complete search history.

(56) References Cited

U.S. PATENT DOCUMENTS

| | | | |
|---|---|---|---|
| 6,091,252 | A | 7/2000 | Akram et al. |
| 6,674,647 | B2 | 1/2004 | Pierson et al. |
| 7,009,297 | B1 | 3/2006 | Chiang et al. |
| 7,888,181 | B2 | 2/2011 | Camacho et al. |

(Continued)

*Primary Examiner* — Hsien Ming Lee
(74) *Attorney, Agent, or Firm* — Renaissance IP Law Group LLP

(57) ABSTRACT

A semiconductor device, a semiconductor package, and a package stack structure include a semiconductor substrate, a first bonding pad disposed on a first surface of the semiconductor substrate, and a first pillar disposed on the first bonding pad. An upper surface of the first pillar has a concave shape. Side surfaces of the first pillar are substantially planar.

17 Claims, 10 Drawing Sheets

(56) References Cited

U.S. PATENT DOCUMENTS

2013/0292831 A1* 11/2013 Liu ............... H01L 23/488
  257/738

2013/0320523 A1* 12/2013 Lee ............... H01L 24/75
  257/737

2014/0077359 A1  3/2014 Tsai et al.

* cited by examiner

SEMICONDUCTOR DEVICES AND PACKAGE SUBSTRATES HAVING PILLARS AND SEMICONDUCTOR PACKAGES AND PACKAGE STACK STRUCTURES HAVING THE SAME

CROSS-REFERENCE TO RELATED APPLICATION

This application claims priority under 35 U.S.C. §119 to Korean Patent Application No. 10-2014-0104440 filed on Aug. 12, 2014, the disclosure of which is hereby incorporated by reference in its entirety.

BACKGROUND

This disclosure relates to semiconductor devices and package substrates having pillars, and to semiconductor packages and package stack structures also having pillars.

Semiconductor packages and package stack structures using a flip chip bonding technology have been commercialized. Since the flip chip bonding technology is a bonding technology using solder balls, the solder ball should have a sufficient volume for a stable bonding. Since the solder ball has a spherical shape, a vertical height and a horizontal width of the solder ball are also increased when the volume of the solder ball is increased. Since intervals or pitches between the solder balls are also increased when the horizontal width of the solder ball is increased, highly integrated semiconductor devices and semiconductor packages cannot be manufactured. This disclosure provides semiconductor devices and package substrates comprising solder balls having horizontal widths that are relatively small while maintaining sufficient volumes, and semiconductor packages and package stack structures having the same.

SUMMARY

Embodiments provide semiconductor devices and package substrates capable of reducing intervals or pitches between pads, pillars, or bumps.

Other embodiments provide semiconductor devices and package substrates comprising pillars of which upper surfaces are concave and side surfaces are substantially planar and substantially vertical.

Still other embodiments provide semiconductor packages and package stack structures comprising the semiconductor devices and/or the package substrates.

Some embodiments provide a semiconductor module and electronic systems comprising the semiconductor devices, the package substrates, the semiconductor packages, and the package stack structures.

Some embodiments provide a method of forming pillars of which upper surfaces are concave and side surfaces are substantially planar and substantially vertical.

In accordance with an embodiment, a semiconductor device comprises a semiconductor substrate having a first surface, one or more first bonding pads disposed on the first surface of the semiconductor substrate, and a first pillar disposed on the first bonding pad. An upper surface of the first pillar comprises a concave shape. Side surfaces of the first pillar are substantially planar.

In accordance with another embodiment, a semiconductor package substrate including a substrate plate and one or more upper substrate pads disposed on the substrate plate, a semiconductor device mounted on an upper surface of the package substrate, and a solder ball. The semiconductor device comprises a semiconductor substrate, one or more chip bonding pads disposed on a lower surface of the semiconductor substrate, and a chip pillar disposed on a lower surface of at least one chip bonding pad. The solder ball is disposed between the chip pillar and the at least one upper substrate pad. The chip pillar comprises a concave upper surface and substantially planar side surfaces.

In accordance with an embodiment, a package stack structure comprises an upper semiconductor package stacked on a lower semiconductor package. The lower semiconductor package comprises a lower semiconductor device mounted on a lower package substrate. The lower semiconductor device includes a lower semiconductor substrate, one or more first chip bonding pads disposed under a lower surface of the lower semiconductor substrate, and a first chip pillar disposed under a lower surface of at least one first chip bonding pad and in which an upper surface of the first chip pillar is concave and side surfaces of the first chip pillar are substantially planar and substantially vertical. The lower package substrate includes a lower substrate plate, one or more upper substrate pads disposed on an upper surface of the lower substrate plate aligned with the at least one first chip bonding pad, and a lower package bump pad disposed on the upper surface of the lower substrate plate.

BRIEF DESCRIPTION OF THE DRAWINGS

The foregoing and other features and advantages of various embodiments will be apparent from the more particular description of preferred embodiments, as illustrated in the accompanying drawings in which like reference characters refer to the same parts throughout the different views. The drawings are not necessarily to scale, emphasis instead being placed upon illustrating the principles of the subject matter disclosed herein. In the drawings.

DETAILED DESCRIPTION OF THE EMBODIMENTS

Figure 1A:
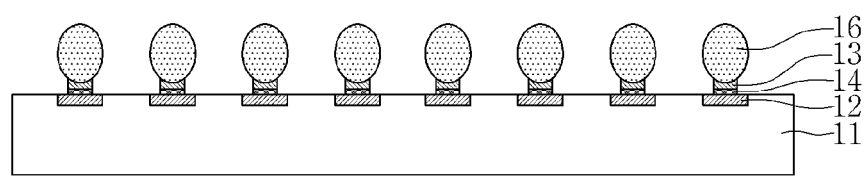
FIG. 1A is a cross-sectional view showing a semiconductor device in accordance with an embodiment.

Various embodiments will now be described more fully with reference to the accompanying drawings in which some embodiments are shown. These embodiments may, however, be embodied in different forms and should not be construed as limited to the particular embodiments set forth herein. Rather, these embodiments are provided so that this disclosure is thorough and complete and fully conveys the scope to those skilled in the art.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

The exemplary embodiments will be described with reference to cross-sectional views and/or plan views, which are ideal exemplary views. Thicknesses of layers and areas are exaggerated for effective description of the technical contents in the drawings. Forms of the embodiments may be modified by manufacturing technology and/or tolerance. Therefore, the embodiments are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited.

Hereinafter, like reference numerals in the drawings denote like elements. Therefore, although like reference numerals or similar reference numerals are not mentioned or described in the drawing, it will be described with reference to the other drawings. Further, although reference numerals are not illustrated, it will be described with reference to the other drawings.

Figure 1B:
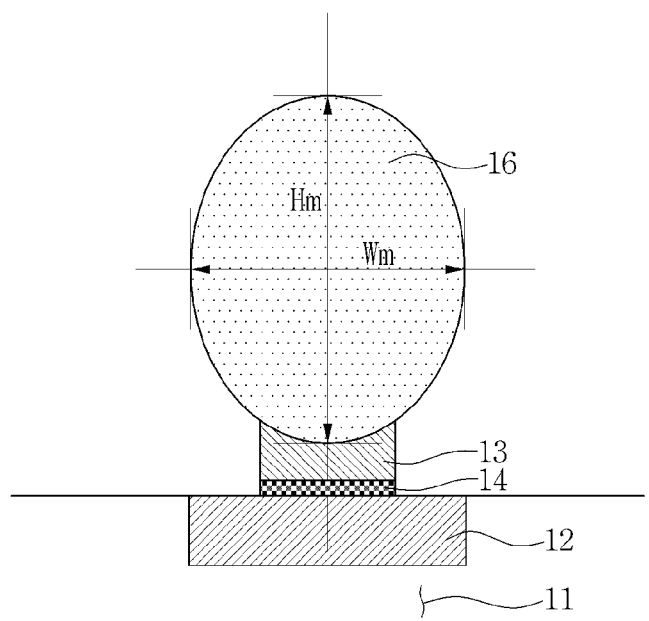
FIG. 1B is an enlarged view showing a part of FIG. 1A.

FIG. 1A is a cross-sectional view showing a semiconductor device in accordance with an embodiment, and FIG. 1B is an enlarged view showing a part of FIG. 1A.

Referring to FIGS. 1A and 1B, a semiconductor device 10A may include a semiconductor substrate 11, one or more chip bonding pads 12 disposed on a first surface of the semiconductor substrate 11, and chip pillars 13 disposed on the one or more chip bonding pads 12.

The semiconductor substrate 11 may comprise, for example, a silicon wafer. The semiconductor substrate 11 may comprise semiconductor circuits. The semiconductor circuits may be formed on an active surface of the semiconductor substrate 11. The semiconductor substrate 11 may comprise a logic device.

The one or more chip bonding pads 12 may be disposed on a first surface of the semiconductor substrate 11. For example, the chip bonding pads 12 may be surrounded or partially covered with an insulating passivation layer. The chip bonding pads 12 may include copper, tungsten, aluminum, or the like.

The chip pillars 13 may be disposed on the one or more chip bonding pads 12. The chip pillars 13 may have a concave dish shape. For example, each of the chip pillars 13 may have a concave upper surface. Side surfaces of the chip pillars 13 may be substantially planar between the upper surface of a chip pillar and a chip bonding pad 12. The side surfaces of each of the chip pillars 13 may be substantially parallel. The chip pillars 13 may comprise nickel, copper, or the like.

The semiconductor device 10A may further include barrier/seed patterns 14. The barrier/seed patterns 14 may be disposed between a chip bonding pad 12 and a chip pillar 13. The barrier/seed patterns 14 may include any one of titanium (Ti), copper (Cu), titanium tungsten (TiW), a titanium/copper (Ti/Cu) double layer, a titanium tungsten/copper (TiW/Cu) double layer, or a combination thereof. When the barrier/seed patterns 14 include the same metals as the chip bonding pads 12 or the chip pillars 13, the barrier/seed patterns 14 may be indistinguishable from bonding pads 12 and chip pillars 13.

The semiconductor device 10A may further include solder balls 16. The solder balls 16 may be disposed on concave upper surfaces of the chip pillars 13. The solder balls 16 may have an egg shape or a vertically oriented oval shape. For example, a vertical height of the solder balls 16 may be greater than a horizontal width of the solder balls 16. The solder balls 16 each may comprise a solder material. For example, the solder balls 16 may include tin (Sn), silver (Ag), copper (Cu), or a combination thereof.

In the semiconductor device 10A, the chip pillar 13 has a concave upper surface so that a contact area between the chip pillar 13 and a lower surface of the solder ball 16 is increased. Therefore, in the semiconductor device 10A, adhesion between the chip pillar 13 and the solder ball 16 may be improved. In the semiconductor device 10A, the solder ball 16 has an egg shape or a vertically oriented oval shape, so that a maximum horizontal width Wm of the solder ball 16 may be smaller than a maximum horizontal width of the solder ball having a circular shape, and a maximum vertical height Hm of the solder ball 16 may be greater than a maximum vertical height of a solder ball having a circular shape. That is, the maximum horizontal width Wm of the solder ball 16 may be smaller than the maximum vertical height Hm of the solder ball 16. As the maximum horizontal width of the solder ball 16 is reduced, an interval or a pitch between the solder balls may be reduced. Therefore, in the semiconductor device 10A, densities of the chip bonding pads 12, the chip pillars 13, and/or the solder balls 16 of the semiconductor device 10A may be increased.

Figure 2A:
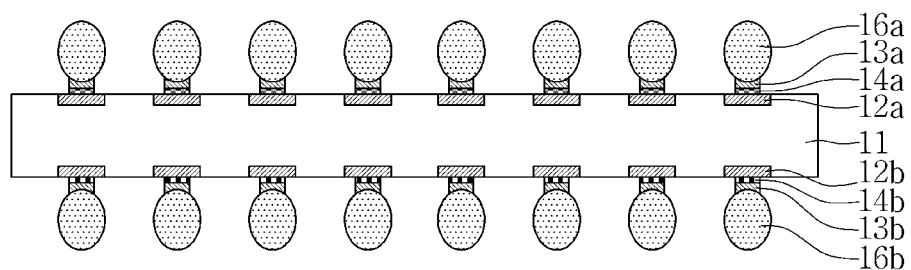
FIGS. 2A and 2B are cross-sectional views showing semiconductor devices in accordance with various embodiments.
Figure 2B:
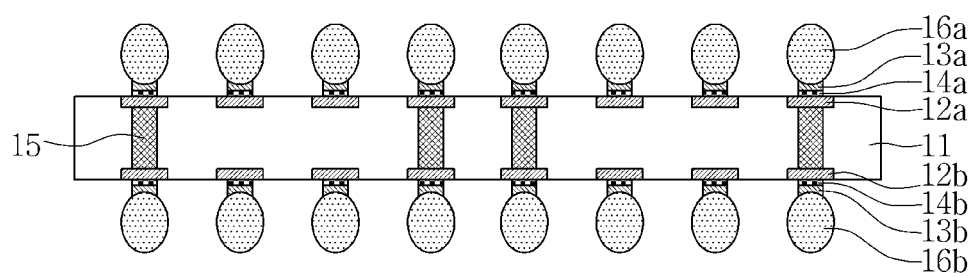

FIGS. 2A and 2B are cross-sectional views showing semiconductor devices in accordance with various embodiments.

Referring to FIG. 2A, a semiconductor device 10B may include semiconductor substrate 11, one or more first chip bonding pads 12a, first chip pillars 13a, one or more second chip bonding pads 12b and second chip pillars 13b. The one or more first chip bonding pads 12a and the first chip pillars 13a may be disposed on an upper surface of the semiconductor substrate 11. The one or more second chip bonding pads 12b and the second chip pillars 13b may be disposed on a lower surface of the semiconductor substrate 11.

The semiconductor device 10B may further include first and second barrier/seed patterns 14a and 14b. The first barrier/seed patterns 14a may be disposed between a chip bonding pad 12a and a chip pillar 13a. The second barrier/seed patterns 14b may be disposed between a chip boding pad 12b and a chip pillar 13b.

The first chip pillars 13a may be disposed on the first chip bonding pads 12a. The second chip pillars 13b may be disposed on the second chip bonding pads 12b. At least one of the first chip pillars 13a and/or at least one of the second chip pillars 13b may have a concave upper surface of a dish shape. At least one of the first chip pillars 13a and/or at least one of the second chip pillars 13b may have substantially planar side surfaces. In the semiconductor device 10B, it is shown that both the first chip pillars 13a and the second chip pillars 13b have the concave upper surfaces of a dish shape. The first chip bonding pads 12a, the second chip bonding pads 12b, the first chip pillars 13a, and the second chip pillars 13b may include a metal, such as copper, nickel, aluminum, or the like.

The semiconductor device 10B may further include first solder balls 16a disposed on the first chip pillars 13a, and second solder balls 16b disposed on the second chip pillars 13b.

Referring to FIG. 2B, a semiconductor device 10C may further include through-substrate vias 15 penetrating the semiconductor substrate 11 as compared to the semiconductor device 10B shown in FIG. 2A. The through-substrate via 15 may electrically connect a first chip bonding pad 12a to a second chip bonding pad 12b. The through-substrate vias 15 may include a through-silicon via (TSV) passing through the semiconductor substrate 11.

Figure 3A:
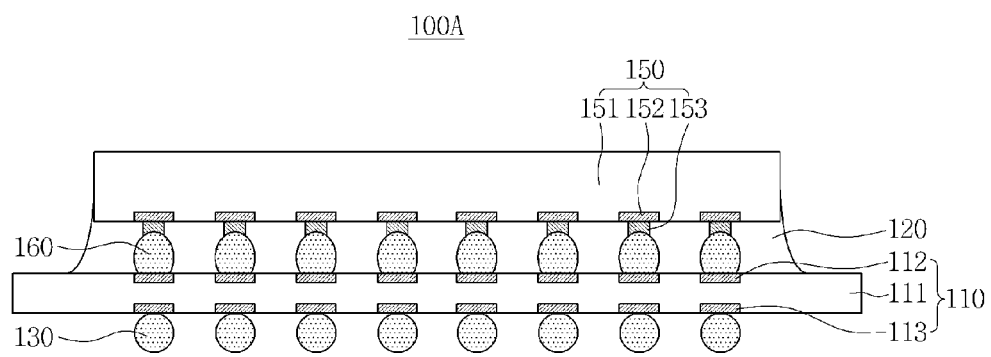
FIGS. 3A and 3B are cross-sectional views showing semiconductor packages in accordance with various embodiments.
Figure 3B:
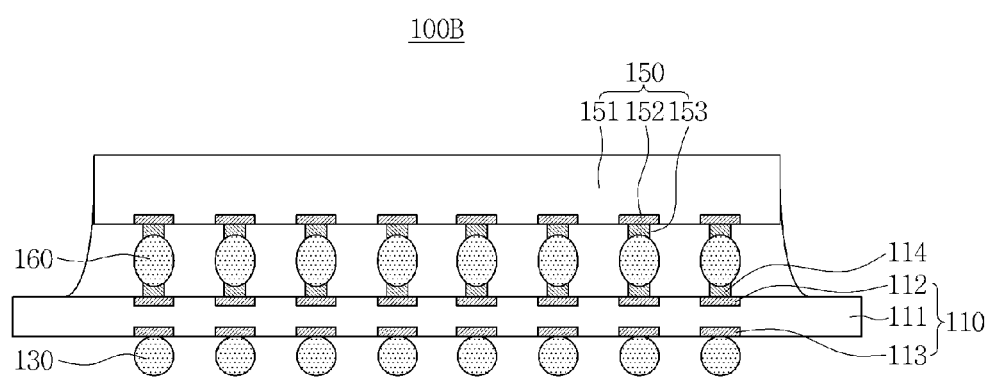

FIGS. 3A and 3B are cross-sectional views showing semiconductor packages in accordance with various embodiments.

Referring to FIG. 3A, a semiconductor package 100A may include a package substrate 110 and a semiconductor device 150 mounted on the package substrate 110.

The semiconductor device 150 may include a semiconductor substrate 151, one or more chip bonding pads 152 disposed on a lower surface of a semiconductor substrate 151, and chip pillars 153 disposed on the one or more chip bonding pads 152. The lower surface of the semiconductor substrate 151 may be an active surface of the semiconductor substrate 151. The semiconductor device 150 may be understood in more detail when referring to FIGS. 1A to 2B. The barrier/seed patterns 14, 14a, and 14b shown in FIGS. 1A to 2B will be omitted from the drawings so as to avoid complicated drawings and descriptions and to facilitate understanding. However, in the various embodiments disclosed herein, although not shown in the drawings, it should be understood that the barrier/seed patterns 14, 14a, and 14b may be present.

The package substrate 110 may include a substrate plate 111, one or more upper substrate pads 112, and one or more lower substrate pads 113.

The substrate plate 111 may comprise an insulating material such as, for example, a ceramic, a plastic, a glass, a high molecular weight organic material, or the like.

The one or more upper substrate pads 112 may be disposed on an upper surface of the substrate plate 111. The one or more upper substrate pads 112 may be aligned with the chip bonding pads 152. The one or more lower substrate pads 113 may be disposed on a lower surface of the substrate plate 111. The lower substrate pad 113 may be electrically connected with the upper substrate pad 112. The upper substrate pads 112 and the lower substrate pads 113 may include copper, nickel, aluminum, or the like.

Solder balls 160 may be disposed on the upper substrate pads 112 of the substrate plate 111. A solder ball 160 may be disposed between a chip pillar 153 and an upper substrate pad 112. A solder ball 160 may contact with a chip pillar 153 and an upper substrate pad 112. Therefore, an upper substrate pad 112 of the substrate plate 111 may be electrically connected with a chip bonding pad 152 of the semiconductor device 150 by a solder ball 160.

The semiconductor package 100A may further include an underfill 120. The underfill 12 may fill a space between the semiconductor device 150 and the substrate plate 111. The underfill 120 may surround the solder balls 160 and the chip pillars 153. An upper surface of the semiconductor device 150 may not be covered with the underfill 120. For example, the underfill 120 may partially cover or surround a side surface of the semiconductor device 150. The underfill 120 may include a thermosetting material, such as an epoxy resin, or the like.

Substrate bumps 130 may be disposed on the lower substrate pads 113 of the substrate plate 111. The substrate bumps 130 may be electrically connected with an external circuit board. The substrate bumps 130 may include a solder material.

Referring to FIG. 3B, a semiconductor package 100B may further include substrate pillars 114 disposed on the upper substrate pads 112 compared to the semiconductor package 100A shown in FIG. 3A. The substrate pillars 114 may have a concave dish shape. For example, the substrate pillars 114 may have a concave upper surface. The substrate pillars 114 may have substantially planar side surfaces. Therefore, the solder balls 160 may be disposed between the chip pillars 153 of the semiconductor device 150 and the substrate pillars 114 of the package substrate 110.

Figure 4A:
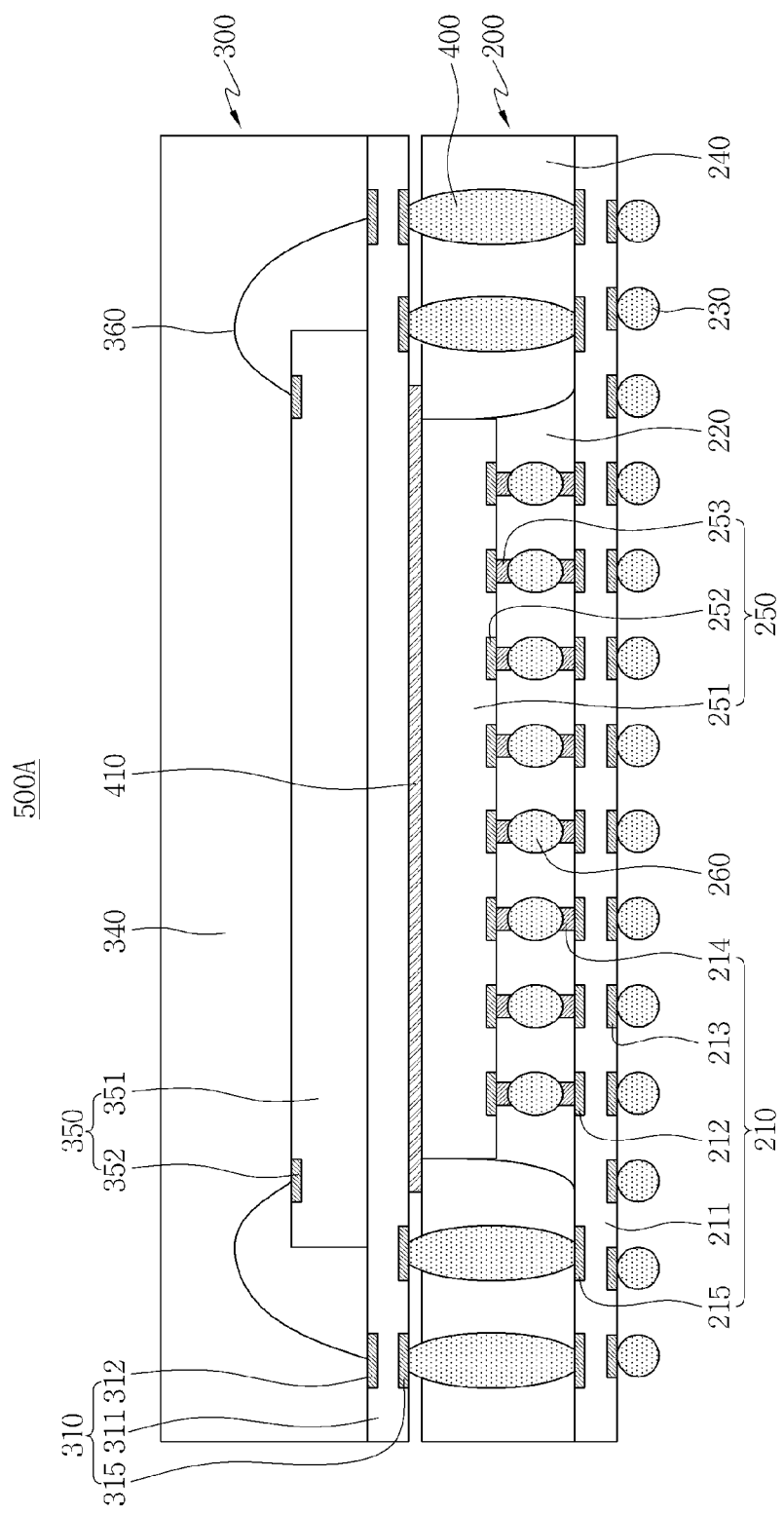
FIGS. 4A to 4C are cross-sectional views showing package stack structures in accordance with various embodiments.
Figure 4B:
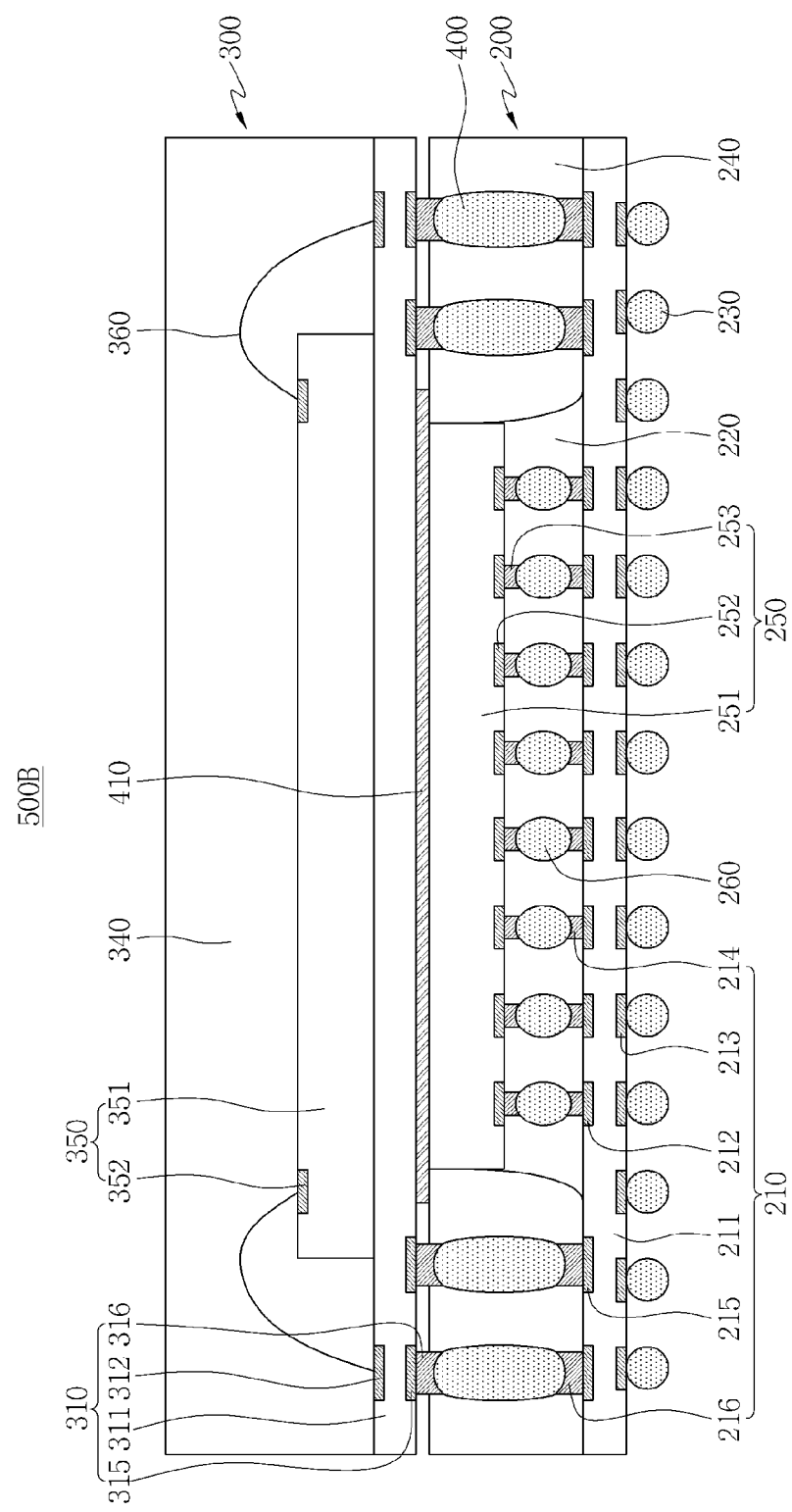
Figure 4C:
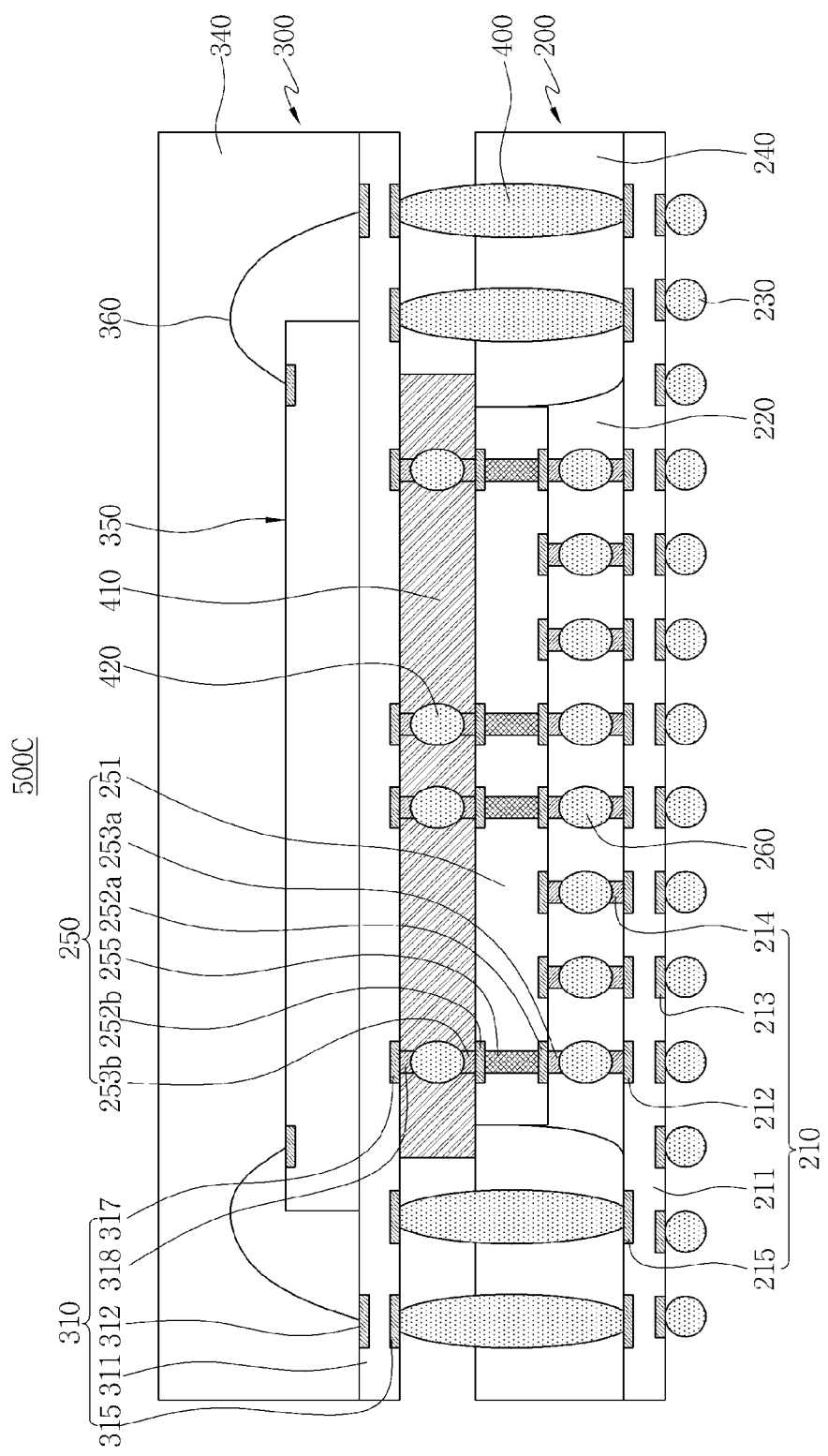

FIGS. 4A to 4C are cross-sectional views showing package stack structures in accordance with various embodiments.

Referring to FIG. 4A, a package stack structure 500A may include a lower semiconductor package 200, an upper semiconductor package 300, and package bumps 400.

The lower semiconductor package 200 may include a lower package substrate 210 and a lower semiconductor device 250 mounted on the lower package substrate 210.

The lower semiconductor device 250 may include a semiconductor substrate 251, one or more chip bonding pads 252 disposed on a lower surface of the semiconductor substrate 251, and chip pillars 253 disposed on the one or more chip bonding pads 252. The lower surface of the semiconductor substrate 251 may be an active surface of the semiconductor substrate 251.

The lower package substrate 210 may include a lower substrate plate 211, one or more upper substrate pads 212, and one or more lower substrate pads 213.

The lower substrate plate 211 may comprise an insulating material such as, for example, a ceramic, a plastic, a glass, a high molecular weight organic material, or the like.

The upper substrate pads 212 may be disposed on an upper surface of the lower substrate plate 211. The upper substrate pads 212 may be aligned with the chip bonding pads 252. The lower substrate pads 213 may be disposed on a lower surface of the lower substrate plate 211. The upper substrate pad 212 and the lower substrate pad 213 may be electrically connected.

Solder balls 260 may be aligned and may contact on the upper substrate pads 212 of the lower substrate plate 211. Therefore, the upper substrate pads 212 and the chip bonding pads 252 of the semiconductor device 250 may be electrically connected.

The package stack structure 500A may further include an underfill 220 which fills a space between the semiconductor device 250 and the lower substrate plate 211 to surround the solder balls 260 and the chip pillars 253. An upper surface of the semiconductor device 250 may not be covered with the underfill 220. For example, the underfill 220 may partially cover or surround a side surface of the semiconductor device 250.

Substrate bumps 230 may be disposed on the lower substrate pads 213 of the lower substrate plate 211.

The lower package substrate 210 may further include substrate pillars 214 on the one or more upper substrate pads 212. The substrate pillars 214 may have a concave upper surface, and substantially planar side surfaces. The solder balls 260 may be disposed on the concave upper surfaces of the substrate pillars 214. The solder balls 260 may be disposed on concave upper surfaces of the chip pillars 253. In another embodiment, any one of the chip pillars 253 and the substrate pillars 214 may be omitted. Therefore, the solder balls 260 may directly contact any one of the chip bonding pads 252 and the substrate pads 212.

The lower package substrate 210 may further include one or more lower package bump pads 215 on the lower substrate plate 211. The one or more lower package bump pads 215 may be disposed on an outer portion of an upper surface of the lower substrate plate 211 to contact the package bumps 400. The lower package bump pads 215 may include a metal, such as copper, nickel, aluminum, or the like.

The lower semiconductor package 200 may further include a lower molding material 240 which covers the lower semiconductor device 250 and side surfaces of the package bumps 400. The lower molding material 240 may comprise an epoxy molding compound, or the like.

The upper semiconductor package 300 may include an upper package substrate 310, an upper semiconductor device 350 mounted on the upper package substrate 310, and one or more bonding wires 360.

The upper package substrate 310 may include an upper substrate plate 311, a one or more upper substrate bonding pad 312, and one or more upper package bump pads 315.

The upper substrate plate 311 may comprise an insulating material such as, for example, a ceramic, a plastic, a glass, a high molecular weight organic material, or the like.

The one or more upper substrate bonding pads 312 may be disposed on an upper surface of the upper substrate plate 311.

The one or more upper package bump pads 315 may be disposed on a lower surface of the upper substrate plate 311.

The upper substrate bonding pad 312 and the upper package bump pad 315 may comprise a metal, such as copper, nickel, aluminum, or the like.

The upper semiconductor device 350 may include a semiconductor substrate 351 and one or more wire bonding pads 352 on the semiconductor substrate 351.

The semiconductor substrate 351, for example, may comprise a silicon wafer or a SiGe wafer. The semiconductor substrate 351 may comprise semiconductor circuits. The semiconductor circuits may be formed on an active surface of the semiconductor substrate 351. The upper semiconductor device 350 may comprise a logic device.

The one or more bonding wires 360 may electrically connect the wire bonding pads 352 to the substrate bonding pads 312. The bonding wires 360 each may comprise gold (Au), or the like.

The upper semiconductor package 300 may further include an upper molding material 340 on the upper package substrate 310 to surround the upper semiconductor device 350 and the bonding wires 360. The upper molding material 340 may comprise an epoxy molding compound, or the like.

The one or more package bumps 400 may be disposed between the lower package bump pads 215 and the upper package bump pads 315. The package bumps 400 may comprise a solder material, or the like. Most parts of side surfaces of the package bump 400 may be surrounded with the lower molding material 240 and side surfaces of an upper part of the package bump 400 may be exposed to the air.

The package stack structure 500A may further include a heat transfer layer 410 between the lower semiconductor device 250 and the upper package substrate 310. The heat transfer layer 410 may directly contact an upper surface of the lower semiconductor device 250 and a lower surface of the upper package substrate 310. The heat transfer layer 410 may comprise a thermal interface material (TIM).

Referring to FIG. 4B, a package stack structure 500B may further include lower package bump pillars 216 on the one or more lower package bump pads 215, and upper package bump pillars 316 on the one or more upper package bump pads 315 as compared to the package stack structure 500A shown in FIG. 4A. The one or more lower package bump pillars 216 and/or one or more the upper package bump pillars 316 may have a concave upper surface, and straight, or substantially straight, side surfaces.

Referring to FIG. 4C, a package stack structure 500C may include a lower semiconductor package 200, an upper semiconductor package 300 and one or more package bumps 400.

The lower semiconductor package 200 may include lower package substrate 210, an underfill 220, substrate bumps 230, a lower molding material 240, a lower semiconductor device 250 and lower solder balls 260. The lower package substrate 210 may include a lower substrate plate 211, one or more upper substrate pads 212, one or more lower substrate pads 213, substrate pillars 214 and one or more lower package bump pads 215.

The lower semiconductor device 250 may include a lower semiconductor substrate 251, one or more lower chip bonding pads 252a, one or more upper chip bonding pads 252b, lower chip pillars 253a, upper chip pillars 253b and one or more through-substrate vias 255. The one or more lower chip bonding pads 252a may be disposed near the lower solder balls 260. The lower chip pillars 253a may be disposed between the lower chip bonding pads 252a and the lower solder balls 260. The one or more upper chip pads 252b may be disposed near the heat transfer layer 410. The upper chip pillars 253b may be disposed on the upper chip pads 252b. The upper chip pillars 253b may be disposed in the heat transfer layer 410. The through-substrate vias 255 may be disposed between the lower chip pillars 253a and the upper chip pillars 253b. The lower chip pillars 253a and the upper chip pillars 253b may be electrically connected.

The upper semiconductor package 300 may include an upper package substrate 310, an upper molding material 240, an upper semiconductor device 350 and bonding wire 360.

The upper package substrate 310 may include an upper substrate plate 311, one or more upper substrate bonding pads 312, one or more upper package bump pads 315, one or more via pads 317 and via pillars 318.

The one or more via pads 317 may be disposed near the heat transfer layer 410. The via pads 317 may be vertically aligned with the upper chip pads 252*b*. The via pillars 318 may be disposed on the via pads 317. The via pillars 318 may be disposed in the heat transfer layer 410.

The package stacked structure 500C may further include middle solder balls 420. The middle solder balls 420 may be disposed between the upper chip pillars 253*b* and the via pillars 318. The upper chip pillars 253*b* and the via pillars 318 may be electrically connected by the middle solder balls 420.

Technical aspects of the package stack structure 500B shown in FIG. 4B and the package stack structure 500C shown in FIG. 4C may be combined.

FIGS. 5A to 5D are views for illustrating a method of forming a semiconductor device in accordance with an embodiment.

Figure 5A:
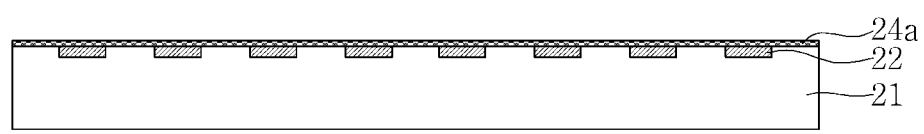
FIGS. 5A to 5D are views for illustrating a method of forming a semiconductor device in accordance with an embodiment.

Referring to FIG. 5A, the method of forming a semiconductor device in accordance with an embodiment may include forming a barrier/seed layer 24*a* on a substrate 21 having one or more pad patterns 22. The substrate 21 may include a semiconductor substrate such as a silicon wafer and a SiGe wafer, or a package substrate, such as a printed circuit board (PCB). The one or more pad patterns 22 each may include a conductive input/output interface such as a bonding pad, a substrate pad, a bump pad, or a via pad. The pad patterns 22 may comprise a metal, such as copper, tungsten, aluminum, or the like. The barrier/seed layer 24*a* may include a double layer having a barrier metal layer and a seed metal layer, or a single layer having both a barrier function and a seed function. Therefore, the barrier/seed layer 24*a* is shown as a single layer in the drawing. The barrier/seed layer 24*a* may include any one of titanium (Ti), copper (Cu), titanium tungsten (TiW), a titanium/copper (Ti/Cu) double layer, a titanium tungsten/copper (TiW/Cu) double layer, or a combination thereof.

Figure 5B:
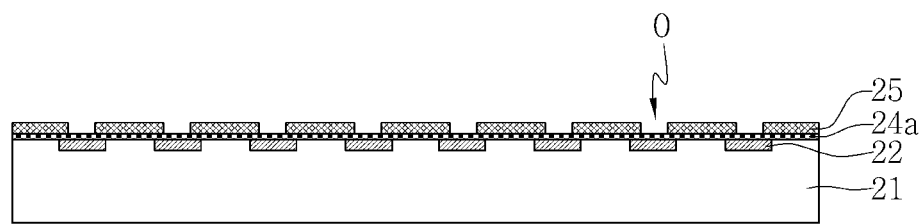

Referring to FIG. 5B, the method may include forming a mask pattern 25 having one or more openings O on the barrier/seed layer 24*a*. The one or more pad patterns 22 may be partially exposed by the openings O. The mask pattern 25 may include a polymer material, such as a photoresist or the like.

Figure 5C:
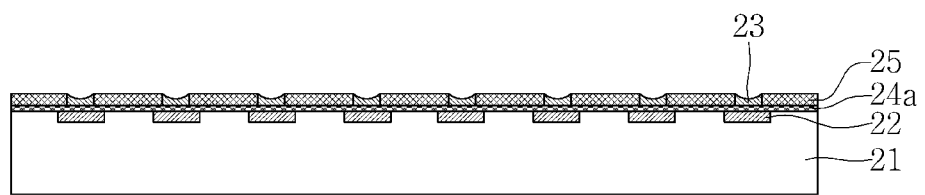

Referring to FIG. 5C, the method may include forming metal pillars 23 on the one or more pad patterns 22 exposed by performing an electroplating process. The electroplating process may be performed using an electrolytic plating solution of which adhesion with the mask pattern 25 or wettability is excellent. Thus, the metal pillars 23 may more rapidly grow on an interface which contacts the mask pattern 25. Therefore, the metal pillar 23 in accordance with an embodiment may have a dish shape in which side surfaces are substantially planar, an upper surface is concave, and a border protrudes.

Figure 5D:
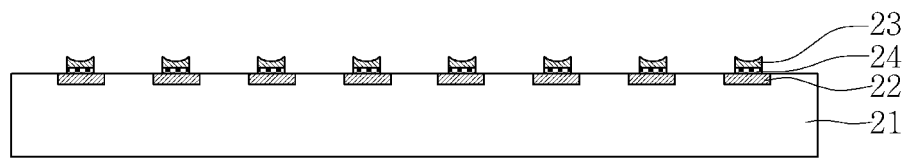

Referring to FIG. 5D, the method may include removing the mask pattern 25. When the mask pattern 25 is removed, a part of the barrier/seed layer 24*a* disposed under the mask pattern 25 may be exposed, and the exposed barrier/seed layer 24*a* may be removed. Therefore, barrier/seed pattern 24 may be formed between the pad pattern 22 and the metal pillar 23. The mask pattern 25 may be removed by performing an ashing process using oxygen plasma or a strip process using sulfuric acid. The barrier/seed layer 24*a* may be removed by performing a wet etching process using an etchant including hydrogen peroxide, citric acid, and water, and/or an etchant including hydrogen peroxide, calcium hydroxide (KOH), and water. When the barrier/seed pattern 24 includes a material that is the same as or similar to the pad pattern 22 or the metal pillar 23, the barrier/seed pattern 24 may be indistinguishable from bonding patterns 22 and metal pillars 23. Therefore, in various products according to the embodiments shown in FIGS. 1A to 4C, the barrier/seed patterns 24 were omitted.

Subsequently, the method may include forming solder balls or solder bumps on concave upper surfaces of the metal pillars 23 by performing a soldering process.

Figure 6A:
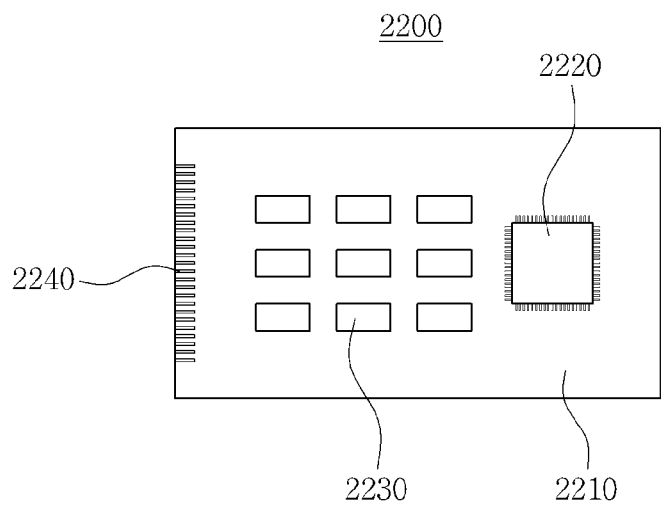
FIG. 6A is a schematic view showing a semiconductor module in accordance with an embodiment.

FIG. 6A is a schematic view showing a semiconductor module in accordance with an embodiment. Referring to FIG. 6A, the semiconductor module 2200 may include a module substrate 2210, a processor 2220, memories 2230 and input/output terminals 2240. The processor 2220, the memories 2230 and the input/output terminals 2240 may be mounted on the module substrate 2210. The processor 2220 and/or the memories 2230 may include any one of the semiconductor devices, the semiconductor packages, and the package stack structures in accordance with various embodiments disclosed herein. The input/output terminals 2240 may be disposed on at least one side of the module substrate 2210.

Figure 6B:
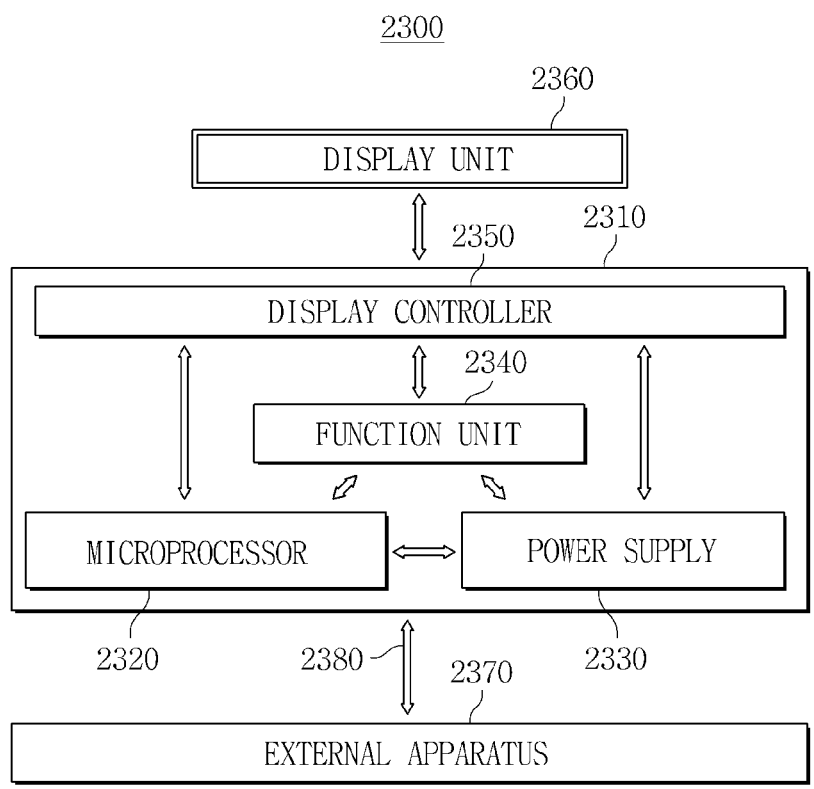
FIGS. 6B and 6C are block diagrams showing electronic systems in accordance with various embodiments.

FIG. 6B is a block diagram showing an electronic system in accordance with an embodiment. Referring to FIG. 6B, the electronic system 2300 may include a body 2310, a display unit 2360, and an external apparatus 2370. The body 2310 may include a microprocessor 2320, a power supply 2330, a function unit 2340, and a display controller 2350. The body 2310 may include a system board or a motherboard having a PCB or the like, and/or a case. The microprocessor 2320, the power supply 2330, the function unit 2340, and the display controller 2350 may be mounted or disposed on an upper surface of the body 2310 or inside the body 2310. The display unit 2360 may be disposed on the upper surface of the body 2310 or inside/outside the body 2310. The display unit 2360 may display an image processed by the display controller 2350. For example, the display unit 2360 may include a liquid crystal display (LCD), active matrix organic light emitting diodes (AMOLED), or various display panels. The display unit 2360 may include a touch screen. Therefore, the display unit 2360 may have an input/output function. The power supply 2330 may supply a current or a voltage to the microprocessor 2320, the function unit 2340, the display controller 2350, etc. The power supply 2330 may include a chargeable battery, a socket for a dry cell, or a voltage/current converter. The microprocessor 2320 may receive a voltage from the power supply 2330 to control the function unit 2340 and the display unit 2360. For example, the microprocessor 2320 may include a CPU or an application processor (AP). The function unit 2340 may include a touch pad, a touch screen, a volatile/non-volatile memory, a memory card controller, a camera, a lighting, an audio and moving picture playback processor, a wireless radio antenna, a speaker, a microphone, a Universal Serial Bus (USB) port, or a unit having other various functions. The microprocessor 2320 or the function unit 2340 may include any one of the semiconductor devices, the semiconductor packages, and the package stack structures in accordance with the various embodiments.

Figure 6C:
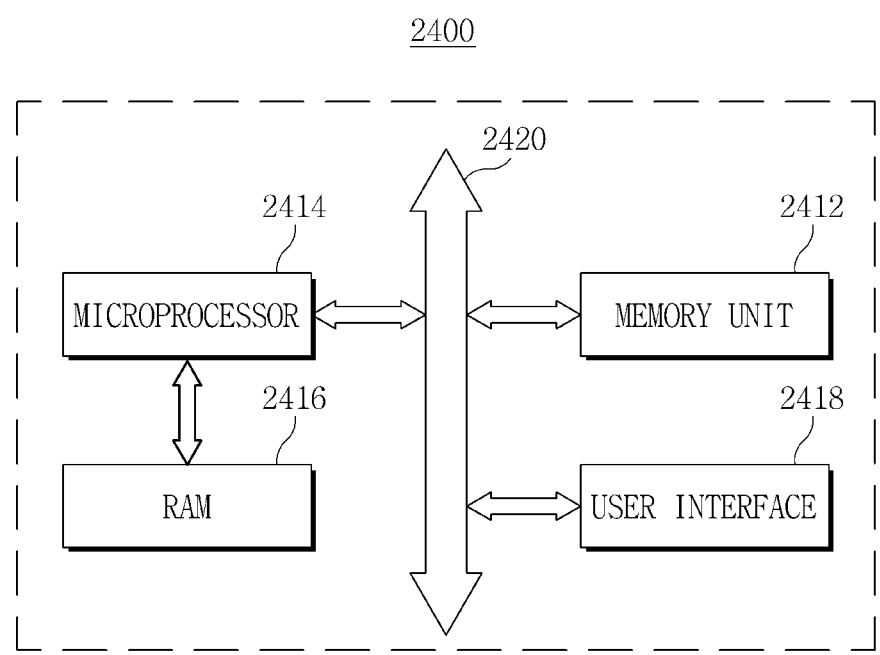

FIG. 6C is a block diagram showing an electronic system in accordance with an embodiment. Referring to FIG. 6C, an electronic system 2400 may include a microprocessor 2414, a memory unit 2412, and a user interface 2418. The microprocessor 2414, the memory unit 2412 and the user interface 2418 may perform data communication using a bus 2420. The microprocessor 2414 may include a CPU or an AP. The electronic system 2400 may further include a RAM 2416 in direct communication with the microprocessor 2414. The microprocessor 2414 and/or the RAM 2416 may be assembled within a single package. The user interface 2418 may be used to input data to the electronic system 2400, or output data from the electronic system 2400. For example, the user interface 2418 may include a touch pad, a touch screen, a keyboard, a mouse, a voice detector, a cathode ray tube (CRT) monitor, an LCD, an AMOLED, a plasma display pad (PDP), a printer, a light, or various input/output devices. The memory unit 2412 may store operational codes of the microprocessor 2414, data processed by the microprocessor 2414, or data received from the outside. The memory unit 2412 may include a memory controller, a hard disk, or a solid state drive (SSD). The microprocessor 2414, the RAM 2416, and/or the memory unit 2412 may include any one of the semiconductor devices, the semiconductor packages, and the package stack structures in accordance with the various embodiments.

Since the semiconductor devices, the package substrates, the semiconductor packages, and the package stack structures in accordance with various embodiments have pillars of which upper surfaces are concave and side surfaces are substantially planar and substantially vertical, the semiconductor devices, the package substrates, the semiconductor packages, and the package stack structures can include solder balls that comprise a vertical height that is greater than a horizontal width. Therefore, a stable flip-chip bonding can be performed, and high integration and a high density of the solder balls can be achieved.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
    a semiconductor substrate comprising a first surface;
    one or more first bonding pads disposed on the first surface of the semiconductor substrate;
    a first pillar disposed on at least one first bonding pad, an upper surface of the first pillar comprising a concave shape and a side surface of the first pillar being substantially planar; and
    a solder ball disposed on the first pillar, a vertical height of the solder ball being greater than a horizontal width of the solder ball.

2. The semiconductor device according to claim 1, further comprising:
    one or more through-substrate vias penetrating the semiconductor substrate, at least one through-substrate via being aligned with the at least one first bonding pad.

3. The semiconductor device according to claim 2, wherein the semiconductor substrate comprises a second surface opposite the first surface,
    the semiconductor device further comprising:
    one or more second bonding pads disposed on the second surface, and
    wherein at least one second bonding pad is electrically connected with a corresponding first bonding pad by the through-substrate via.

4. The semiconductor device according to claim 3, further comprising a second pillar disposed on the at least one second bonding pad.

5. The semiconductor device according to claim 4, wherein the second pillar comprises a concave upper surface, and substantially planar side surfaces.

6. The semiconductor device according to claim 1, wherein the first pillar comprises copper and/or nickel.

7. The semiconductor device according to claim 1, further comprising;
    a barrier layer disposed between at least one first bonding pad and a corresponding first pillar.

8. The semiconductor device according to claim 7, wherein the barrier layer comprises titanium (Ti).

9. The semiconductor device according to claim 1, wherein the first bonding pad comprises copper, tungsten or aluminum.

10. A semiconductor package, comprising:
    a package substrate comprising a substrate plate and one or more upper substrate pads disposed on the substrate plate;
    a semiconductor device mounted on an upper surface of the package substrate, the semiconductor device comprising a semiconductor substrate, one or more chip bonding pads disposed on a lower surface of the semiconductor substrate, and a chip pillar disposed on a lower surface of at least one chip bonding pad, the chip pillar comprising a concave upper surface and a side surface of the chip pillar being substantially planar;
    a solder ball disposed between at least one upper substrate pad of the package substrate and the concave upper surface of the chip pillar; and
    a substrate pillar disposed between the upper substrate pad and the solder ball.

11. The package according to claim 10, wherein the substrate pillar comprises a concave upper surface, and substantially planar side surfaces.

12. The semiconductor package according to claim 11, wherein the solder ball contacts the concave upper surface of the chip pillar and the concave upper surface of the substrate pillar.

13. The semiconductor package according to claim 10, further comprising:
    a lower substrate pad disposed on a lower surface of the substrate plate.

14. The semiconductor package according to claim 10, wherein the semiconductor package is part of a system comprising a touch screen display.

15. A semiconductor device, comprising:
    a semiconductor substrate comprising a first surface and a second surface opposite from the first surface;
    one or more first bonding pads disposed on the first surface;
    one or more second bonding pads disposed on the second surface;
    a first pillar disposed on at least one first bonding pad, an upper surface of the first pillar comprising a concave shape; and
    one or more through-substrate vias penetrating the semiconductor substrate, at least one through-substrate via being aligned with the at least one first bonding pad and a corresponding second bonding pad.

16. The semiconductor device according to claim 15, further comprising:

a second pillar disposed on at least one second bonding pad, an upper surface of the second pillar comprising a concave shape.

17. The semiconductor device according to claim 15, wherein the semiconductor device comprises part of an electronic system comprising a touch screen display.

\* \* \* \* \*